United States Patent [19]

Modschiedler

[11] Patent Number: 4,582,130
[45] Date of Patent: Apr. 15, 1986

[54] HEAT EXCHANGER FOR AN ELECTRONICS CABINET

[75] Inventor: Kurt Modschiedler, Neunkirchen, Fed. Rep. of Germany

[73] Assignee: Siemens Aktiengesellschaft, Munich and Berlin, Fed. Rep. of Germany

[21] Appl. No.: 588,020

[22] Filed: Mar. 9, 1984

[30] Foreign Application Priority Data

Mar. 28, 1983 [DE] Fed. Rep. of Germany ....... 3311212

[51] Int. Cl.⁴ .......................... F28F 3/04; H01F 27/20
[52] U.S. Cl. ................................ 165/104.33; 165/165; 361/384
[58] Field of Search ................ 165/165, 104.33, 166

[56] References Cited

U.S. PATENT DOCUMENTS

| | | | |
|---|---|---|---|
| 2,553,030 | 5/1951 | Bell | 165/166 |
| 2,828,946 | 4/1958 | Smith | 165/165 |
| 2,953,110 | 9/1960 | Etheridge | 165/165 |
| 3,847,211 | 11/1974 | Fischel et al. | 165/166 |

FOREIGN PATENT DOCUMENTS

| | | |
|---|---|---|
| 2006759 | 12/1971 | Fed. Rep. of Germany . |
| 2231469 | 3/1974 | Fed. Rep. of Germany . |
| 2444864 | 10/1976 | Fed. Rep. of Germany . |
| 3026196 | 2/1982 | Fed. Rep. of Germany . |
| 892021 | 3/1962 | United Kingdom ................ 165/165 |

Primary Examiner—Albert W. Davis, Jr.
Attorney, Agent, or Firm—F. W. Powers; J. L. James

[57] ABSTRACT

The invention relates to a heat exchanger for an electronics cabinet with a folded surface profile in which, alternatingly on both faces every other fold is closed off gastight or dustproof by a cross cover. With such an air/air heat exchanger the waste heat from the interior of an electronics cabinet can be dissipated to the outside when the electronics cabinet is closed dusttight. To facilitate production of the folded surface profile, the cross covers are integrally formed onto the folds. Such a folded surface profile, in which the folds and the cross covers form one integral component, is preferably produced as a deepdrawn part, so it is possible to make the component from plastic. In another embodiment, the folded surface profile can be a plastic injection molding.

5 Claims, 10 Drawing Figures

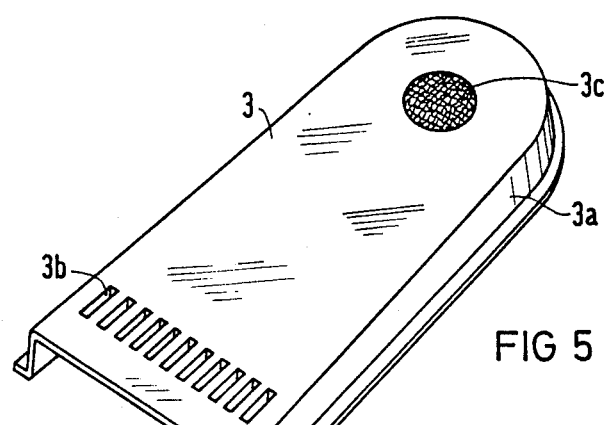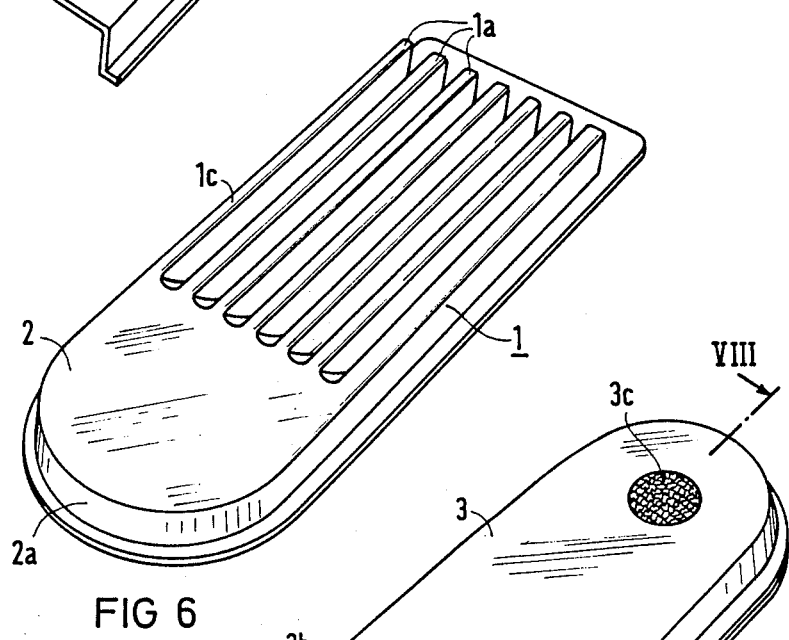
FIG 5
FIG 6
FIG 7

HEAT EXCHANGER FOR AN ELECTRONICS CABINET

BACKGROUND OF THE INVENTION

The invention relates to a heat exchanger for an electronic cabinet, with a folded surface profile in which, alternatingly on both faces, every other fold is closed gastight by a cross cover.

Existing air/air heat exchangers are disclosed in German patent applications DE-AS No. 20 06 759 and DE-AS No. 22 31 469, German patent DE-PS No. 24 44 864 and published German patent application DE-OS No. 30 26 196. These heat exchangers, which may be made of aluminum or plastic, have a multiplicity of parallel folds. The face of each fold is provided with a cross over, and the cross covers of adjacent folds are disposed alternatingly on the one or the other face. Attached to the side surfaces of the folded surface profile are plates, by means of which the folds are covered to form closed flow channels. In the area of cross covers openings for the folds, which open towards the respective side surface, are provided in these plates. In this manner two separate flow paths are obtained for the cabinet air and for the outside air, in which the flow in the folded surface profile goes in opposite directions. These heat exchangers replace a part of the housing wall of the electronics cabinet, or they may be inserted in the electronics cabinet door. They serve to dissipate the heat generated by the electronic components in the electronics cabinet, while the interior of the electronics cabinet remains closed and therefore dustproof. Producing the folded surface profile with its cross covers is expensive. In German patent DE-PS No. 24 44 864, for example, an embodiment of the folded surface profile is described where sheet metal strips with folded faces are joined to each other and bonded to the two cover plates. The folds bonded to each other form the cross covers, and the folded profile itself is formed by the two cover plates. To assure dustproofing, the bond between the folds as well as between the sheet metal strips and the cover plates themselves must be made with great care. Moreover, a protracted period of time is required for the adhesive to harden. In the embodiment described in published German patent application DE-OS No. 30 26 196, the folded profile is formed from sheet metal bent into a meander shape or plastic molded into a meander shape. To provide cross covers, sheet metal parts or appropriately shaped plastic parts must be attached singly to the face and possibly also bonded to the folds. Both production methods are extremely expensive because of the personnel and time required, even in mass production.

SUMMARY OF THE INVENTION

It is an object of the invention to provide a heat exchanger for an electronics cabinet which can be easily and inexpensively produced.

According to the invention, an exchanger is disclosed in which the cross covers are integrally formed onto the folds of the folded surface profile.

In the heat exchanger according to the invention the cross covers are integral parts of the folded surface profile, formed during the production of the folded surface profile. Therefore, subsequent attachment of separately formed parts or subsequent bonding of folds is no longer necessary so that, particularly in mass production, both time and personnel costs can be lowered considerably. In addition, when applying the cover plates, it suffices to assure a dustproof joint along the circumferential line of the folded surface profile, because all folds open towards a side surface of the folded surface profile and therefore belong to the same flow path. This, also contributes to a considerable simplification of production.

The folded surface profile is preferably a deepdrawn part which may also be made of plastic, or the folded surface profile may be an injection molded plastic part. Particularly for deepdrawing a simple die is sufficient so that production is not made more expensive by requirements for a special die.

In a preferred embodiment there is provided on one face of the folded surface profile, parallel to its side surfaces, a plateshaped tab. This tab serves to separate the two flow paths outside of the folded surface profile, thereby further simplifying the design of the entire heat exchanger.

The depth of the folds is preferably about six times the distance between the bellows walls of the folded surface profile. Taking this ratio into account, producing the folded surface profile by the deep-drawing method is also realizable without difficulties.

To optimize the heat exchange between the two flow paths separated by bellows walls, the mutual spacing of the bellows walls in the folded surface profile may be chosen as a function of the intended air flow velocity in the folds so that a turbulent flow develops in the folds. The flow turbulence may be improved further by providing the bellows walls of the folded surface profile with hurdles such as knubs or webs.

To make it possible to build folded surface profiles of different lengths, the folded surface profile may be constructed of at least two profile parts joined to each other form-lockingly and gastight. It has proven to be advantageous to connect the profile parts through tongue and groove connections. With this embodiment it is possible to construct by the building block principle, folded surface profiles of any length, and therefore, also heat exchangers of different sizes with two profile parts, namely one in which the folds are integrally provided with cross covers and one without cross covers for the folds. This offers advantages both as far as production and maintaining inventory are concerned.

Other features and advantages of the present invention will become apparent from the following detailed description, and from the claims.

For a full understanding of the present invention, reference should now be made to the following detailed description and to the accompanying drawings.

BRIEF DESCRIPTION OF THE DRAWINGS

FIGS. 5 to 7 show various perspective views of the heat exchanger according to the invention.

DETAILED DESCRIPTION

Figure 1:
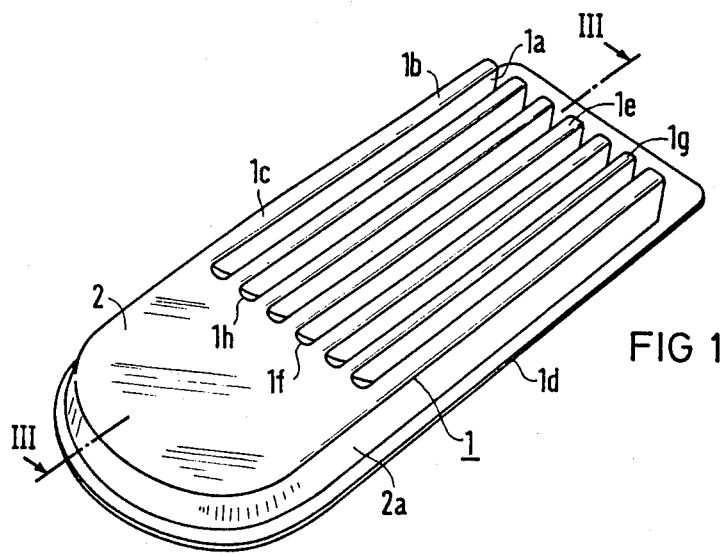
FIG. 1 is a perspective view of a folded surface profile for a heat exchanger according to the invention.

Referring to FIG. 1 a folded surface profile of the heat exchanger is shown.

Folded surface profile 1 includes a multiplicity of parallel folds 1a and 1b, which are meandershaped in section. Folds 1a are open towards side surface 1c and folds 1b are open towards side surface 1d of folded surface profile 1 (which is not visible in FIG. 1). At faces 1e and 1f of the folded surface profile, the folds 1a and 1b are alternatingly closed off by cross covers 1g and 1h. This seals folds 1a, open towards side surface 1c visible in FIG. 1, at least dusttight against folds 1b open towards rear side surface 1d. In the embodiment shown in FIG. 1, a plate 2 (which will be discussed later in greater detail) is formed on folded surface profile 2. This design of the folded surface profile is also shown in FIG. 1, which is a view of face 1e of the folded surface profile.

This section reveals a fold 1a of folded surface profile 1, which is open towards side surface 1c and closed off by cross cover 1h. The fold 1a, therefore, ends in face 1e. Adjacent (not visible) fold 1b is closed off by cross cover 1g, and air can flow into this fold 1b from face 1f.

Figure 3:
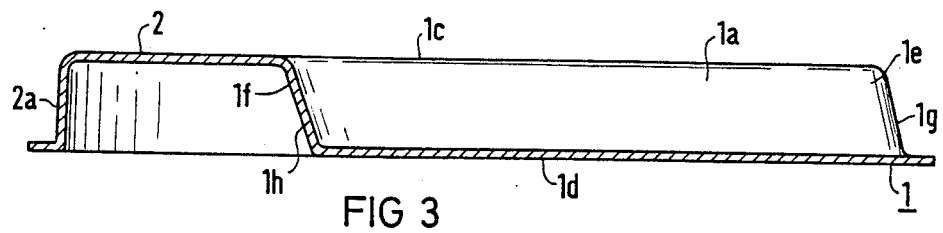
FIG. 3 shows a section along line III—III of FIG. 1.
Figure 2:
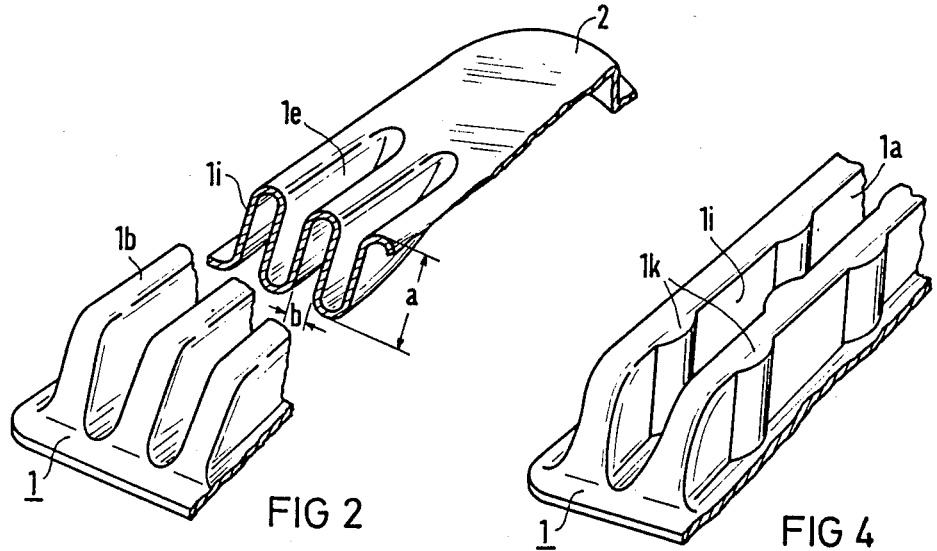
FIG. 2 shows in section, the meander shaped portion of the folded surface profile with the parallel bellows walls.

The folded surface profile explained with FIGS. 1-3 correspond to folded surface profiles known from the previously mentioned patents. It has already been discussed that closing the folds by means of the cross covers makes the production of these folded surface profiles costly. These production difficulties are circumvented in the folded surface profiles shown in FIGS. 1-3 because cross covers 1g and 1h are integral parts of folded surface profile 1 and are formed integrally onto respective faces 1e and 1f of folds 1a and 1b. In practice it is advantageous to produce such a single piece folded surface profile 1 as a deepdrawn metal or plastic part or plastic injection molding. This can be done with simple, inexpensive dies to that production is not burdened with costly dies. Moreover, because of the relatively low die costs different dies to optimize the folded surface profile can be built.

It is evident, particularly from FIG. 3, that cross covers 1g and 1h are disposed obliquely. This provides such fold 1a and 1b with an inlet or outlet opening which widens in a funnel shape, fits the flow section of the coolant flow, and does not increase the flow resistance in the area of the inlet or outlet openings. Such funnel shaped inlet or outlet openings are already disclosed in the folded surface profile described in German patent DE-PS No. 24 44 864.

In FIG. 3, the fold depth has the reference symbol a and the mutual spacing of two bellows walls 1i is designated b. It is advantageous, particularly for deepdrawn parts, to design the folded surface profile so that the fold depth a is about 6 times the distance b between two bellows walls 1i. To optimize the heat transfer through bellows walls 1i from one flow path to the other, it is beneficial to also select the distance b between two bellow walls as a function of the intended flow velocity of the air in the fold so as to obtain a turbulent air flow in the fold. This prevents the formation of a heat gradient transverse to the air flow, which optimizes the thermal conduction through bellows walls 1i. Furthermore, the distances b for the bellows walls or ribs 1i may be different for folds 1a and 1b. This makes it possible to adapt the amount of air calculated in the inside and outside circulations to the waste heat to be removed from the interior of the cabinet.

Figure 4:
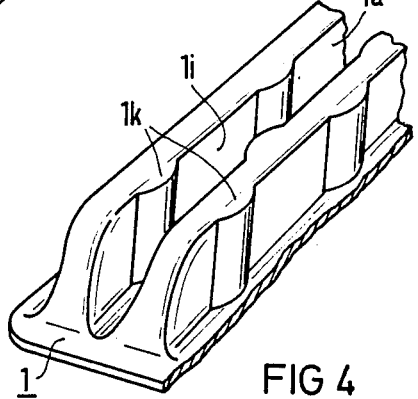
FIG. 4 is a cutaway perspective view showing a structure for increasing the flow turbulence.

The perspective view of FIG. 4 shows another possibility for increasing the flow turbulence. In FIG. 4, bellow walls are provided with obstructions 1k projecting into the flow path of fold 1a. Such obstructions 1k, which may be webs as in the embodiment shown, or knubs, will increase the turbulence of the flow in fold 1a. The effect of increased turbulence can be improved further by staggering obstructions 1k on opposite bellows wall 1i, as in the embodiment shown in FIG. 4.

In FIGS. 1-3, a plate 2 provided with a sidewall 2a extending in the outer bellows wall of folded surface profile 1 is formed onto the folded surface profile. This plate 2 separates the two separate flow paths of folds 1a and 1b which are also outside of folded surface profile 1. It is also possible for plate 2 to serve as an assembly surface and for the housing formed by sidewalls 2a to accomodate a fan and its electrical terminals.

FIGS. 5-7 illustrate the design of a heat exchanger according to the invention, which has a folded surface profile according to FIG. 1 which is shown also in FIG. 6. To cover folds 1a a plate 3 is provided. This plate has a domelike design due to sidewalls 3a. In plate 3, serving as assembly aid, openings 3b are provided, and a fan is accomodated in an opening 3c. According to FIG. 7, plate 3 is plugged into folded surface profile 1. Openings 3b are located in the area of cross covers 1h and over open folds 1a. It suffices for a dustproof connection of cover 3 to folded surface profile 1 if side surfaces 3a are joined in a gas or a dusttight manner to outer bellows walls 1i and plate 3 along the peripheral line of the face 1f to the heat exchanger profile 1. This can be accomplished by appropriate gaskets, which facilitates a later removal of cover 3 to clean folds 1a. Cover 3 and folded surface profile 1 may also be bonded to each other for a gastight connection. It is also advantageous with regard to the stability of the heat exchanger if the transverse webs between bellows walls 1i on the entire side surface 1c of folded surface profile 1 are fastened to plate 3.

Figure 8:
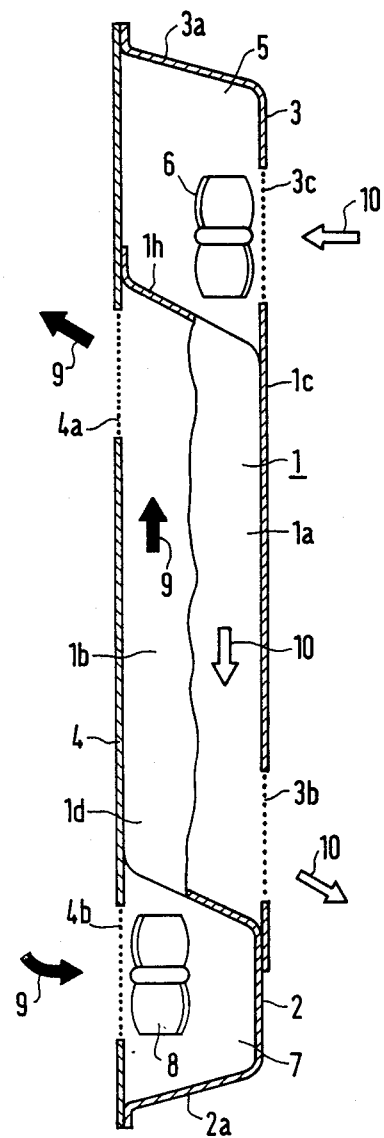
FIG. 8 shows a sectional view along line VIII—VIII of FIG. 7 of a ready-for-use heat exchanger according to the invention.

Finally, FIG. 8 shows a ready-for-use heat exchanger according to the invention. It shows an embodiment according to FIG. 7, in which attached to side surface 1d of folded surface profile 1 is a supporting plate 4 which projects beyond the folded surface profile and is joined gastight to sidewall 3a of cover 3 and to sidewall 2a of housing plate 2. What has been said with regard to FIG. 7 also applies to the gas or dustproof connection of plate 4 to folded surface profile 1 and to sidewalls 2a and 3a. It is especially favorable to fasten sidewall 3a detachably and gas-tight to plate 4, with for example with a gasket, to make it possible to remove cover 3 to clean folds 1a. Openings 4a, disposed in the area of cross covers 1h over folds 1b are provided in supporting plate 4. Finally, air for the second flow path is supplied through another opening 4b. With cover 3 and supporting plate 4 a housing 5 is realized, in which a fan 6 for air circulation is accomodated. A similar housing 7 is formed by housing part 2 together with supporting plate 4. In this housing 7 is installed fan 8 for the other air circulation, together with its electrical terminals. It is assumed for the two circulations that openings 4a and 4b in supporting plate 4, end in the interior of the cabinet. The travel of the air inside the electronic cabinet is indicated by arrows 9.

The air inside the cabinet enters the heat exchanger through openings 4b, flows through folds 1b, and returns cooled into the interior of the cabinet through openings 4a. The circulation of the outside air is indicated by arrows 10. It enters through openings 3c, flows through folds 1a in the opposite direction of the air flow in folds 1b, and discharges to the outside again through openings 3b. Since the two circulations 9 and 10 are separated from each other gas or dusttight, the dissipation of the waste heat of the electronics cabinet which is closed dusttight is assured.

Figure 9:
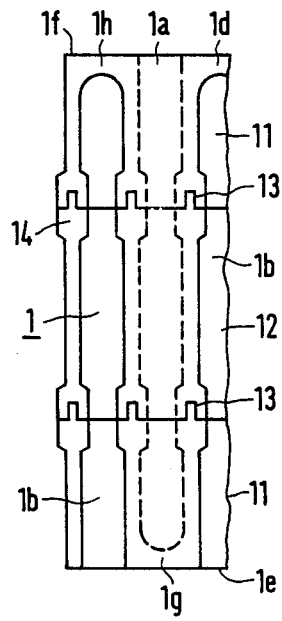
FIG. 9 shows a top view of a side surface of an embodiment of the heat exchanger according to the invention.
Figure 10:
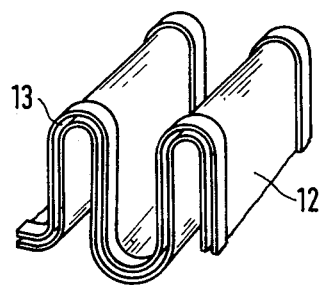
FIG. 10 shows a perspective view of the tongue and groove connection utilized in the invention.

Another embodiment of a folded surface profile 1 for a heat exchanger according to the invention is shown in FIG. 9. In this embodiment, folded surface profile 1 includes profile parts 11 and 12 interconnected gas and dusttight by form-locking connections 13. In this embodiment, a tongue and groove connection is provided as a form-locking connection. The two profile parts 11 of this embodiment are of identical design, both having covers 1h and 1g integrally formed to folds 1a and 1b. Profile part 12, inserted as an intermediate part, is shown in perspective view in FIG. 10 to illustrate the tongue and groove connection. With such profile parts 11 and 12, folded surface profiles 1 of different lengths can be constructed by the building block principle, thus simplifying production of different sizes and stock requirements considerably. It has proven to be advantageous to produce profile parts 11 and 12 as plastic injection moldings. The thicker sections 14 in the area of the form-locking connection 13 serve additionally to increase the turbulence of the flow, as already explained in detail with regard to FIG. 4.

There has thus been shown and described a novel method for a heat exchanger for an electronics cabinet, which fulfills all the objects and advantageous sought therefor. Many changes, modifications, variations and other uses and applications of the subject invention will, however, become apparent to those skilled in the art after considering the specification and the accompanying drawings which disclose preferred embodiments thereof. All such changes, modifications, variations and other uses and applications which do not depart from the spirit and scope of the invention are deemed to be covered by the invention which is limited only by the claims which follow.

What is claimed is:

1. In an electronics cabinet, a heat exchanger comprising a folded surface profile having a depth of each fold of the folded surface profile approximately six times a width of each fold of the folded surface profile to facilitate forming in a single deep drawing operation from a single piece of plastic material, wherein alternatingly on both faces, every other fold is closed gastight by a cross cover, the cross covers being integrally formed also from the single piece of plastic material, onto the folds of the folded surface profile.

2. The heat exchanger according to claim 1, further comprising a plate-shaped tab provided on one face of the folded surface profile, parallel to its side surfaces.

3. The heat exchanger according to claim 1, further comprising a cover for one of the side surfaces of the folded surface profile, wherein the cover is provided with a plate-shaped tab.

4. The heat exchanger according to claim 1, further comprising bellows walls provided with obstructions.

5. The heat exchanger according to claim 4, wherein the distance between the bellows walls in the folded surface profile is selected as a function of the intended flow velocity of the air in the folds so a turbulent flow develops in the folds.

* * * * *